United States Patent [19]

Tsironis

[11] Patent Number: 4,841,169
[45] Date of Patent: Jun. 20, 1989

[54] DUAL-GATE FET AMPLIFIER-MIXER WITH INTERMEDIATE OHMIC ISLAND FOR REJECTING A FREQUENCY BAND

[75] Inventor: Christos Tsironis, Montgeron, France

[73] Assignee: U.S. Philips Corporation, New York, N.Y.

[21] Appl. No.: 833,571

[22] Filed: Feb. 24, 1986

Related U.S. Application Data

[63] Continuation of Ser. No. 469,593, Feb. 24, 1983, abandoned.

[30] Foreign Application Priority Data

Mar. 3, 1982 [FR] France ............................ 82 03510

[51] Int. Cl.[4] .................. H03K 3/26; H03K 3/353
[52] U.S. Cl. ............................ 307/303; 307/304; 307/529; 307/520; 357/51; 333/104
[58] Field of Search ............ 307/304, 529, 305, 303, 307/520; 357/51, 127, 128, 104; 330/305

[56] References Cited

U.S. PATENT DOCUMENTS

| | | | |
|---|---|---|---|
| 3,986,060 | 10/1976 | Nishizawa et al. ............ | 307/304 |
| 4,048,646 | 9/1977 | Ogawa et al. .................. | 357/15 |
| 4,334,324 | 6/1982 | Hoover ........................... | 455/333 |
| 4,409,557 | 10/1983 | Sechi .............................. | 330/227 |

OTHER PUBLICATIONS

IEEE Journal of Solid-State Circuits, Jun. 1969, "Improvement In the Tetrode FET Noise Figure by Neutralization and Tuning" by A. vn der Ziel et al.

Microwave Field-Effect Transistors-Theory, Design and Applications by Raymond S. Pengelly, 1982, pp. 233-244, 44-50.

IEEE Transactions on Electron Devices, vol. ED-25, No. 6, Jun. 1978, "GaAs Dual-Gate MESFET's", Furutsuka et al.

Journal of Physics E:Scientific Intruments (Jan. 1971), vol. 4, M. J. Lazarus et al. "Operation of Dual Gate MOSFET at 77K and Use in RF and Video Amplifiers".

Primary Examiner—Stanley D. Miller
Assistant Examiner—Richard Roseen
Attorney, Agent, or Firm—Robert J. Kraus

[57] ABSTRACT

A dual gate field effect transistor having an intermediate ohmic island between the two transistor halves is connected to operate as an amplifier-mixer for rejecting a frequency band. A paragraph continued series resonant circuit comprising an inductance and a capacitor is connected at one of its ends to the ohmic island of the field effect transistor and at the other end to ground. Polarization voltages are applied to each electrode of the dual-gate transistor so that the first half or part of the transistor extending from the source electrode to the ohmic island is brought into a state of saturation and the second part of the transistor extending from the ohmic island to the drain electrode is brought into a state of non-saturation.

2 Claims, 3 Drawing Sheets

DUAL-GATE FET AMPLIFIER-MIXER WITH INTERMEDIATE OHMIC ISLAND FOR REJECTING A FREQUENCY BAND

This is a continuation of application Ser. No. 469,593, filed Feb. 24, 1983 now abandoned.

BACKGROUND OF THE INVENTION

The invention relates to a semiconductor device for mixing a received signal and a signal supplied by a local oscillator, for amplifying the result of this mixing process, and for rejecting a given frequency band. The semiconductor device comprises a dual gate field effect transistor with an intermediate ohmic island between two transistor halves of the dual gate field effect transistor. The source electrode is connected to ground, the received signal is applied to the first gate, and the signal supplied by the local oscillator is applied to either the first or the second gate of the dual gate field effect transistor. The resultant output signal is available at the drain electrode.

The invention relates to the field of semiconductor components, and more particularly to their application in the field of superfrequency satellite telecommunications.

The dual gate field effect transistor having an intermediate ohmic island is known from the prior art, especially from the U.S. Pat. No. 4,048,646 filed on Feb. 25, 1976 under Japanese priority on behalf of the assignee NIPPON ELECTRIC COMPANY, Limited From publications by Van der Ziel and Takagi in I.E.E.E. Journal of Solid State Circuits (corresp). Vol. SC-4, June 1969, p. 170–172 in an article entitled "Improvement in the tetrode FET noise figure by neutralization and tuning", it is known to connect externally in cascade the common and intermediate electrode of an assembly of two FET transistors in order to reduce the noise level.

Such an assembly of two FET transistors connected in cascade is described, for example, in U.S. Pat. No. 3,986,060. More particularly in FIG. 9 of this patent, a device is illustrated in which the common and intermediate electrode is connected to ground through a resonant LC circuit.

It is well known from the prior art, for example, from an article published in I.E.E.E. Transactions on Microwave theory and techniques, Vol. MTT 23, No. 6, June 1975, entitled "Performance of dual-gate GaAS MESFET's as gain-controlled low-noise amplifiers and high-speed modulators," by C. A. LIECHTI, that a dual-gate transistor is equivalent to two single gate FET's connected in cascade. However, the circuit illustrated in FIG. 9 of U.S. Pat. No. 3,986,060 is limited to amplifiers, and does not relate to mixers.

Various ways of using a dual-gate field effect transistor, are known (e.g. as a mixer, modulator, power limiter, frequency multiplier, self-oscillating mixer etc.). The invention, however relates to a novel use of this known device in combination with inductive and capacitive elements to obtain a mixer-amplifier circuit suitable for rejecting a given frequency band.

It is known from the prior art to use a passive filter for rejecting bands by means of local elements and by way of example reference is made to the article "Monolithic low-noise amplifiers" by D. MAKI, R. ESFANDIARI and M. SIRACUSA published in MICROWAVES, pages 103–106, of October 1981. The disadvantage such a filter consists mainly in that losses on the order of 2 to 3 dB are introduced at the frequency of the signal, while band rejection is about 25 to 30 dB.

It is also known to use comparatively complex assemblies comprising several dual-gate transistors. By way of example, reference is made to the article "An X-band dual-gate MESFET Image rejection mixer", 1978, International Microwave Symposium Digest, pages 300–302.

SUMMARY OF THE INVENTION

It is an object of the invention to obtain the rejection of a frequency band without losses and in a simple and less laborious integratable form.

According to the invention, the semiconductor device is characterized in that it further comprises a resonant circuit of the type comprising an inductance and a capacitor arranged in series connected through a first end to the ohmic island and through its second end to earth. Polarization voltages are applied to each electrode of the dual gate field effect transistor so that the first part of the transistor extending from the source electrode to the ohmic island is brought into a state of saturation and the second part of the transistor extending from the ohmic island to the drain electrode is brought into a state of non-saturation.

In this manner, the semiconductor device is polarized s that the first part of the dual-gate transistor (designated as FET 1) serves as a pre-amplifier, while the second part of the dual-gate transistor (designated as FET 2) serves as a mixer. The filter, composed of a resonant circuit of the LC type connected to the ohmic island, is arranged before the mixer, thus preventing unwanted reflections of parasitic frequencies to preceding elements and reducing noise originating from these elements.

DESCRIPTION OF THE PREFERRED EMBODIMENT

Figure 1:
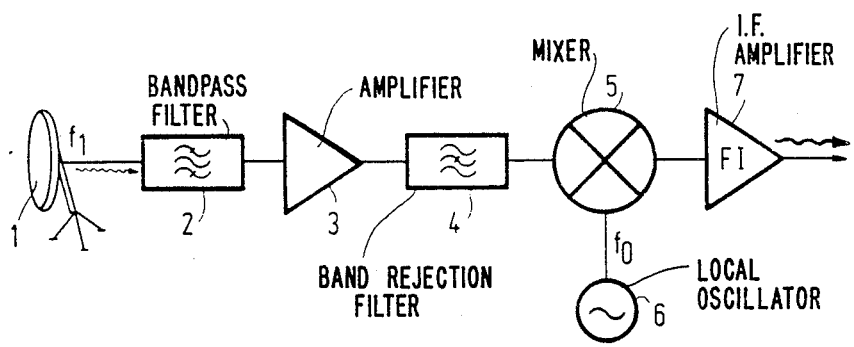
FIG. 1 is a block diagram of a receiver front end for receiving satellite television broadcast signals.

The block diagram of FIG. 1 shows the receiver front end for frequency translation of a signal emitted, for example, by a satellite and received on earth by an antenna 1 constituted by a parabolic reflector having a diameter of about one meter. The receiver front end is arranged in the focus of the antenna 1 and comprises a bandpass filter 2, a pre-amplifier 3 (operable at for example, 12 GHz), and a frequency band rejection filter 4. The band rejection filter functions to (a) suppress noise originating from the antenna at the image frequency, and (b) suppress the signals at the image frequency produced in the mixer device. The receiver front end also comprises a mixer 5 connected to the band rejection filter 4, an input thereof being supplied with pilot signal $f_o$ of, for example, 11 GHz originating from a local oscillator 6, which may include (not shown) a temperature-stabilized field effect transistor, and, for example, a dielectric resonator. Finally the receiver front end comprises an intermediate frequency amplifier 7 (operable at, for example, 1 GHz) connected to the output of the mixer 5.

The frequencies present at various points of the receiver front end, as described above in very general sense, are shown in FIG. 2. A frequency band lying substantially between 11.7 and 12.5 GHz is typically utilized for the system of teledistribution by satellites. This choice of the frequency band results from the necessity of saving power on board the satellite and hence of emitting preferably in the radio frequencies substantially between about 0.5 and 50 GHz, the accurate attribution of the frequency bands being determined by an international organization, the CCIR., according to the UIT.

The signal emitted by satellite within this frequency band is received on earth by an individual or a communal antenna and is converted via several steps into a signal of a much lower frequency, so that it can be processed by a standard television receiver. A first frequency conversion (which will be described in detail hereinafter) results in an intermediate frquency of 1 GHz; other down conversions (not shown) results in a frequency of about 130 MHz, at which (not shown) frequency demodulation is effected. The demodulated signal is thereafter amplitude modulated on a carrier frequency, and applied to a standard television receiver (not shown)

Figure 2:
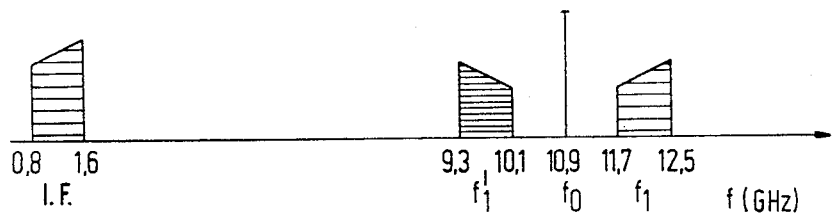
FIG. 2 shows the varios frequency bands present at various points in the receiver front end.

In FIG. 2 the frequency of the local oscillator ($f_o \sim 10.9$ GHz) is represented by a vertical line. The intermediate frequency signal band resulting from mixing of the local oscillator frequency in mixer 5 with the received satellitte signal is represented by the band lying substantially between 0.8 and 1.6 GHz. The parasitic frequency band (image band) lies between 9.3 and 10.1 GHz in this numerical example and results from the mixing process between harmonics of the local oscillator frequency (in the present case $2f_o \sim 21.8$ GHz) and of the received frequency band (11.7–12.5 GHz). This parasitic frequency band is indesirable, because, if it is directed toward the preceding elements, it can adversely affect their operation. On the other hand, the noise and all the parasitic signals received by the antenna and amplified by the pre-amplifier in the image frequency band are also converted into the intermediate frequency band and increase the noise factor or disturb reception. It is therefore necessary to arrange a band rejection filter (designated in FIG. 1 by reference numeral 4) which operates by absorption or reflection of the transmitted energy. In the case of operation by reflection, the energy produced in the mixer at the image frequency ($2f_o - f_1$) may be recovered, thereby impriving the conversion factor of the mixer.

Figure 3:
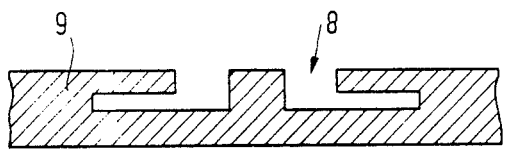
FIG. 3 shows an embodiment of a band rejection filter according to the prior art.

An embodiment according to the prior art of this band rejection filter 4 is shown in FIG. 3 as a channel in the form of a "spur" 8 realized in a micro-strip line 9 (generally referred to as a "spur-line filter"). Such a superfrequency band rejection filter is known from the article published in Microwaves, Optics and Acoustics of November 1977, Vol. 1., No. 6, entitled "Design of microstrip spur-line band stop filters" by R. N. BATES.

As is shown in FIG. 3, a conducting strip 9 is provided with spur-shaped notches 8, in this case two symmetrically opposite notches each constituted by a first rectilinear slot at right angles to the edge of the conducting strip, and by a second rectilinear slot parallel to the edge of the strip and located at the center thereof. The lengths of the parts of the conducting strip insulated by said notches defines the central frequency of the rejected frequency band and normally corresponds to $1 = \frac{3}{4} \lambda$, $\lambda$ being the wavelength in the dielectric material of the substrate.

Other filter types may be used as well as the filter described above, realized by means of local elements (MICROWAVES, October 1981), but the main disadvantage of the known construction is the fact that they are arranged in series on the superfrequency conducting lines and that they thus introduce losses on the order of 2 to 3 dB at the frequency of the signal (12 GHz), while the band rejection is effected satisfactorily at a rate of about 25 to 30 dB.

Figure 4:
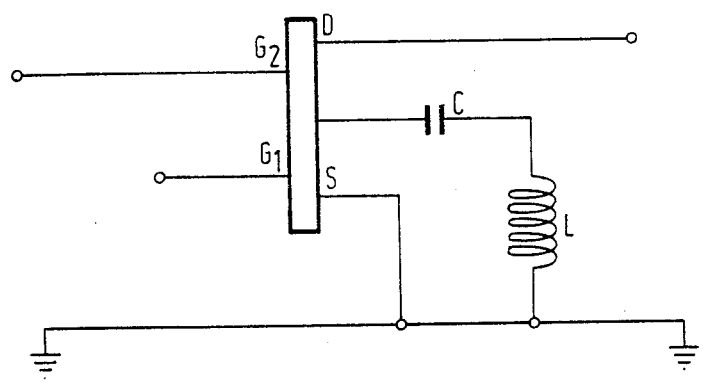
FIG. 4 shows the amplifier-mixer circuit for selective rejection of a frequency band according to the invention.

FIG. 4 shows the construction according to the present invention of an amplifier-mixer circuit for selectively rejecting a frequency band. The component used is a dual-gate field effect transistor and an intermediate ohmic island between the two transistor halves of the dual gate transistor.

For a correct use of this component as a mixer, the source electrode (S) is connected to ground, the signals to be mixed are applied to the gate electrodes ($G_1$ and $G_2$) and the mixed signal is recovered at the drain electrode (D). The frequency rejection is obtained in accordance with the invention by connecting a series resonant circhuit of the type comprising an inductance and a capacitor (LC) through one of its ends to the ohmic island $\Omega$ of the field effect transistor and through the other end to ground.

However, according to this construction, when the signal received by the antenna is applied to the first gate electrode ($G_1$) and the signal supplied by the local oscillator is applied to one or the other gate electrode ($G_1$ or $G_2$), mixing is effected under normal operating conditions in the first part (FET 1) of the transistor. In this case, the construction is not suitable because the filter is located after the mixer and not before it.

In order to obtain a suitable construction, it is necessary for the filter to be located before the mixer, that is to say that in the present case the mixing is effected in the second part (FET 2) of the transistor.

Figure 5:
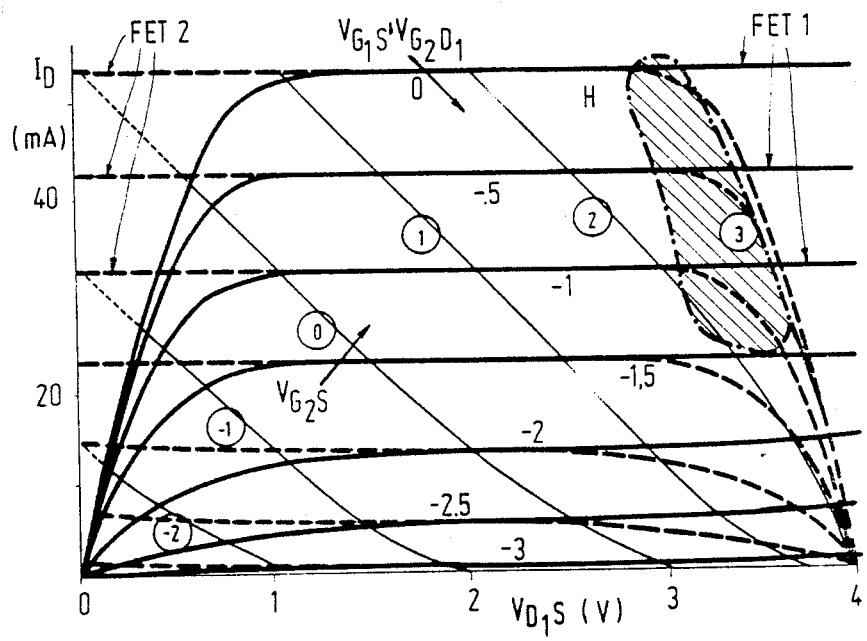
FIG. 5 shows the electrical characteristics of such a circuit.

According to the invention, such operation is obtained by polarizing the dual-gate transistor in the manner which is apparent from the analysis of the two-dimensional characteristic curves of the transistor shown in FIG. 5. This analysis is also described in the article "DC Characteristics aid dual gate FET analysis" (MICROWAVES, pages 71–73, July 1981, TSIRONIS and MEIERER). In the present case the polarization voltages of the dual gate transistor are chosen in the cross-hatched zone H for the first transistor half or part (FET 1) of the component so that this part (FET 1) is brought into a linear state of saturation and in the non-saturation zone for the second part (FET 2) so that this part (FET 2) is brought into a non-linear state of non-saturation.

With a component of gallium arsenide GaAs, specially designed by the applicant and having the following characteristics: Width of gate $G_1$ ($W_1 \sim 1$ $\mu$m), width of gate $G_2$ ($W_2 \sim 1$ $\mu$m) and distance between drain and source ($W \sim 6$–$8$ $\mu$m), the operating conditions in the cross-hatched zone H have simply been obtained with the following polarizations:

$V_{DS} \sim 4$ volts, 0 volt $> V_{G_1}S > -1.5$ volt, 2.5 volt $< V_{G_2}S < 3.5$ volts, while the drain current reached values between 20 and 50 mA.

In this manner, the operation of the device is satisfactory and the selective rejection of the frequency band exceeds 30 dB. The width of the rejected frequency band is reduced to a value of 100 MHz by the use of coaxial intermediate frequency (1 GHz) tuning members having a high Q factor.

Figure 6:
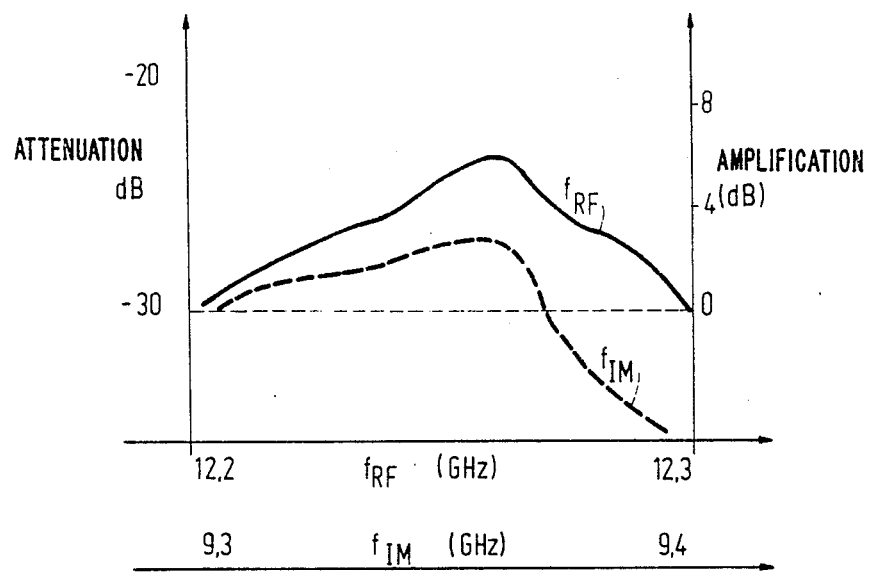
FIG. 6 is a graph illustrating the performance realized by means of a amplifier-mixer device according to the invention.

FIG. 6 is a graph illustrating the performances obtained by means of this novel device. The first curve, indicated by a full line, represents the results obtained at the signal frequency, the frequency (between 12.2 and 12.3 GHz) being plotted on the abscissa, and the amplification—(between 3 and 6 dB)—being plotted on the ordinate. The second curve, indicated by dotted lines, represents the results obtained at the image frequency, the frequency—(between 9.3 and 9.4 GHz)—being plotted on the ascissa and the attenuation—(between $-25$ and $-35$ dB)—being plotted on the ordinate.

Figure 7:
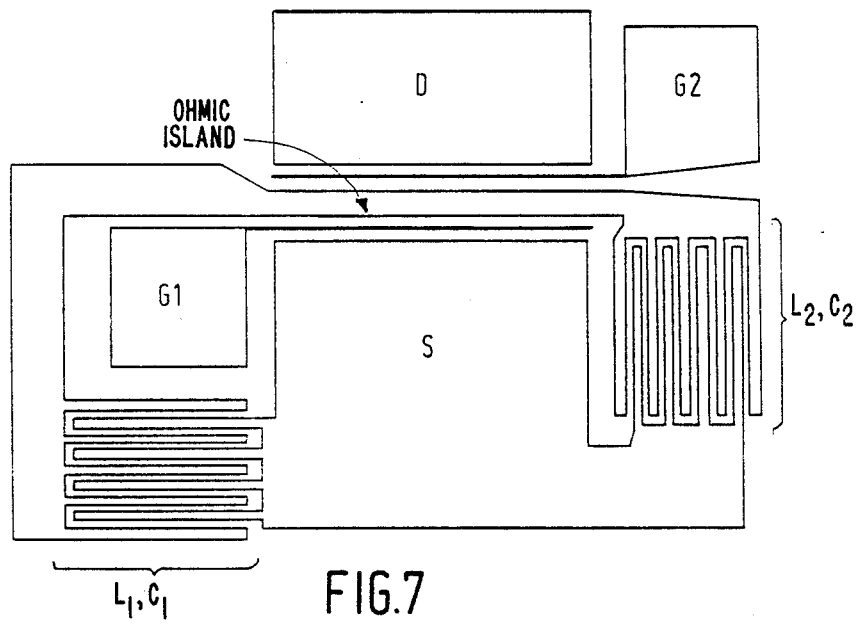
FIG. 7 shows an integrated form of the circuit according to the preceding FIG. 4.

Finally, FIG. 7 shows an integrated form of this novel device in a plan view. The active component is formed on a mesa obtained by epitaxial growth from the vapour phase and etching according to a known self-alignment technology. The passive elements, i.e. inductance and capacitor, are constituted by an interdigitated structure, which may, for example, be divided into two separate parts, whose values ($L_1$, $C_1$ and $L_2$, $C_2$), which are slightly different, permit the widening of the rejected frequency band.

These elements may also be obtained on the surface of an integrated semiconductor device by extensions of the metal layers formed in the steps of the self-alignment method along a helical path (inductance) and by a supplementary metal deposition, an insulating dielectric layer being meanwhile deposited according to a bridge configuration (capacity).

It will be clear to those skilled in the art that numerous modifications of the present invention can be obtained by variation of techniques according to the prior art without inventive effort, and hence within the scope of the present invention as defined by the following appended claims.

What is claimed is:

1. An amplifier-filter-mixer device comprising a single dual-gate field effect transistor including a semiconductor substate on which are disposed:
    (a) a source electrode spaced apart from a drain electrode;
    (b) spaced-apart first and second gate electrodes located between the source and drain electrodes;
    (c) an ohmic island located between the first and second gate electrodes; and
    (d) a band rejection filter comprising a resonant circuit including an inductor and a capacitor electrically connected in series, said resonant circuit having first and second ends, the first end being electrically connected to the ohmic island;
    said device being operable such that when predetermined bias voltages are applied thereto:
    (1) a first part of the field effect transistor electrically coupled to the first gate electrode and extending from the source electrode to the ohmic island effects amplification of an input signal applied to the first gate electrode;
    (2) a second part of the field effect transistor electrically coupled to the second gate electrode and extending from the ohmic island to the drain electrode effects mixing of the amplified input signal with a local oscillator signal applied to the second gate electrode; and
    (3) said resonant circuit rejects noise signals received at the first gate electrode and parasitic signals produced during mixing of the input signal and the local oscillator signal;
    said predetermined bias voltages including a common reference voltage applied to the source electrode and the second end of the resonant circuit, and voltages applied to the drain electrode and the first and second gate electrodes which effect saturated operation of the first part of the field effect transistor and non-saturated operation of the second part of the field effect transistor.

2. An amplifier-filter-mixer device as in claim 1 where said resonant circuit comprises an interdigitated conductive layer on said substrate.

* * * * *